US006583660B2

United States Patent
Blon et al.

(10) Patent No.: US 6,583,660 B2
(45) Date of Patent: Jun. 24, 2003

(54) ACTIVE AUTO ZERO CIRCUIT FOR TIME CONTINUOUS OPEN LOOP AMPLIFIERS

(75) Inventors: Thomas Blon, Santa Cruz, CA (US); Sasan Cyrusian, Scotts Valley, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/865,389

(22) Filed: May 25, 2001

(65) Prior Publication Data

US 2002/0175731 A1 Nov. 28, 2002

(51) Int. Cl.[7] ................................................ H03L 5/00
(52) U.S. Cl. .......................................... 327/307; 330/9
(58) Field of Search ................................ 327/2, 3, 5, 7, 327/8, 10, 12, 40, 41, 47, 307, 236–239, 243–247, 258; 330/9, 51

(56) References Cited

U.S. PATENT DOCUMENTS

| 4,833,418 A | | 5/1989 | Quintus et al. ................. 330/9 |
| 5,798,664 A | * | 8/1998 | Nagahori et al. ............ 327/307 |
| 5,812,023 A | | 9/1998 | Jones .............................. 330/9 |
| 5,821,810 A | | 10/1998 | Swart et al. ................. 330/254 |
| 6,087,897 A | * | 7/2000 | Wang .......................... 327/124 |
| 6,140,872 A | * | 10/2000 | McEldowney .............. 327/307 |
| 6,163,215 A | | 12/2000 | Shibata et al. .............. 330/254 |
| 6,194,941 B1 | * | 2/2001 | Zarabadi et al. ............ 327/307 |
| 6,259,313 B1 | * | 7/2001 | Lewicki ...................... 327/554 |
| 6,407,630 B1 | | 6/2002 | Yao et al. ....................... 330/9 |

OTHER PUBLICATIONS

"Synchronous Recording Channels—PRML & Beyond", rev. 5.61 14.E. 18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accessed Apr. 9, 2001.

"MR and PRML: Technologies In Synergy" available at on the Internet at http://www.lionsgate.com/Home/Baden/public_index/SCSI/Quantum_White _Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—My-Trang Nu Ton
(74) Attorney, Agent, or Firm—Brinks Hofer Gilson & Lione

(57) ABSTRACT

An active offset cancellation circuit for an open loop differential amplifier is disclosed. The amplifier is operated on a two-phase clock where the normal operation occurs on the first phase and offset detection and cancellation occurs on the second phase. On the second phase, the offset cancellation circuit measures the offset created by the amplifier when both differential inputs are connected to a common source. The circuit then adjusts a bias current and stores this adjustment to cancel offset during the operational phase of the amplifier. During the operational phase, the first phase of the clock, the stored adjustment is used to bias the current in one of the two input stages of the amplifier, canceling any offset imparted by the amplifier circuitry. One each clock cycle, any additional offset is similarly detected and canceled.

10 Claims, 2 Drawing Sheets

ACTIVE AUTO ZERO CIRCUIT FOR TIME CONTINUOUS OPEN LOOP AMPLIFIERS

BACKGROUND

Computer hard disk drives, also known as fixed disk drives or hard drives, have become a de facto standard data storage component of modern computer systems and are making further inroads into modern consumer electronics as well. Their proliferation can be directly attributed to their low cost, high storage capacity and high reliability, in addition to wide availability, low power consumption, high data transfer speeds and decreasing physical size.

These disk drives typically consist of one or more rotating magnetic platters encased within an environmentally controlled housing that further includes all of the electronics and mechanics to read and write data and interface with other devices. Read/write heads are positioned above each of the platters, and typically on each face, to record and read data. The electronics of a hard disk drive are coupled with these read/write heads and include numerous components to control the position of the heads and generate or sense the electromagnetic fields representing data. These components receive data from a host device, such as a personal computer, and translate that data into magnetic encodings written onto the disk platters by the heads. Further, when a host device requests data from the drive, the electronics locates the desired data, senses the magnetic encodings which represent that data and translates those encodings back into the binary digital information which the host device can understand. Further, error detection and correction algorithms are applied to ensure accurate storage and retrieval of data.

One area in which significant advancements have been made has been in the area of read/write head technology and the methods of interpreting the magnetic fluctuations sensed by these heads. The read/write head, of which a typical hard disk has several, is the interface between magnetic platters and the disk drive electronics. The read/write head actually reads and writes the magnetically encoded data as areas of magnetic flux on the platters. Data, consisting of binary 1's and 0's, are encoded by sequences of the presence or absence of flux reversals recorded or detected by the read/write head. A flux reversal is a change in the magnetic flux in two contiguous areas of the disk platter. Traditional hard drives read data off the platters by detecting the voltage peak imparted in the read/write head when a flux reversal passes underneath the read/write head as the platters rotate. This is known as "peak detection." However, increasing storage densities require reduced peak amplitudes and better signal discrimination and higher platter rotational speeds are pushing the peaks closer together thus making peak detection more difficult to accomplish.

Magneto-resistive ("MR") read/write heads have been developed with increased sensitivity to sense smaller amplitude magnetic signals and with increased signal discrimination to address some of the problems with increasing storage densities. In addition, another technology, known as Partial Response Maximum Likelihood ("PRML"), has been developed to further address the problems with peak detection as densities and rotational speeds increase. Borrowed from communications technology, PRML is an algorithm implemented in the disk drive electronics to interpret the magnetic signals sensed by the read/write heads. PRML-based disk drives read the analog waveforms generated by the magnetic flux reversals stored on the disk. However, instead of looking for peak values to indicate flux reversals, PRML-based drives digitally sample this analog waveform (the "Partial Response") and use advanced signal processing technologies to determine the bit pattern represented by that wave form (the "Maximum Likelihood"). This technology, in conjunction with magneto-resistive ("MR") heads, have permitted manufacturers to further increase data storage densities. PRML technology further tolerates more noise in the sensed magnetic signals permitting the use of lower quality platters and read/write heads which increases manufacturing yields and lowers costs.

With many different drives available from multiple manufacturers, hard disk drives are typically differentiated by factors such as cost/megabyte of storage, data transfer rate, power requirements and form factor (physical dimensions) with the bulk of competition based on cost. With most competition between hard disk drive manufacturers coming in the area of cost, there is a need for enhanced hard disk drive components which prove cost effective in increasing supplies and driving down manufacturing costs all while increasing storage capacity, operating speed, reliability and power efficiency.

SUMMARY

The present invention is defined by the following claims, and nothing in this section should be taken as a limitation on those claims. By way of introduction, the preferred embodiments described below relate to a differential amplifier. The amplifier includes a first input stage operative to receive a first input signal, a second input stage operative to receive a second input signal, and an output stage operative to produce an output signal equal to the amplification of the difference between the first signal and the second signal. The amplifier further includes an offset cancellation circuit operative to actively cancel offset voltage imparted in the output signal caused by the differential amplifier.

The preferred embodiments further relate to a method of canceling offset between first and second stages of an open loop differential amplifier. In one embodiment, the method includes disconnecting inputs to the first and second stages from an input source, connecting the inputs to a common voltage source, detecting output offset voltage on outputs of the amplifier, computing an adjusted bias current to cancel the output offset voltage, disconnecting the inputs from the common voltage source, reconnecting the inputs to the input source, and applying the adjusted bias current to cancel the output offset voltage.

Further aspects and advantages of the invention are discussed below in conjunction with the preferred embodiments.

DETAILED DESCRIPTION OF THE PRESENTLY PREFERRED EMBODIMENTS

The embodiments described herein relate to a PRML-based read/write channel device for hard disk drive controllers. The read/write channel is a device coupled with the read/write heads of the hard disk drive. Herein, the phrase "coupled with" is defined to mean directly connected to or indirectly connected with through one or more intermediate components. Such intermediate components may include both hardware and software based components. The read/write channel converts binary/digital data from the host device into the electrical impulses which drive the read/write head to magnetically record the data to the disk drive platters. Further, the read/write channel receives the analog waveform magnetically sensed by the read/write heads and converts that waveform back into the binary/digital data stored on the drive.

Figure 1A:
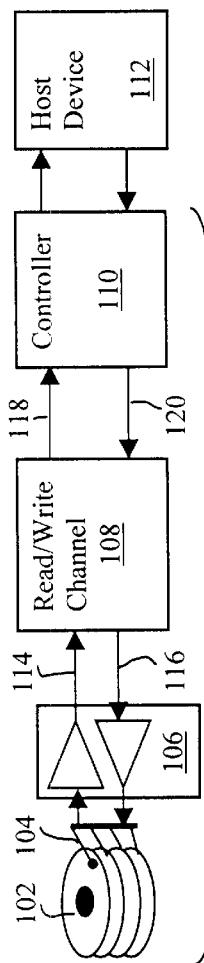
FIG. 1A depicts a block diagram of an exemplary hard disk drive coupled with a host device.

Referring to FIG. 1A, there is shown a block diagram of an exemplary hard disk drive 100 coupled with a host device 112. For clarity, some components, such as the servo/actuator motor control, are not shown. The drive 100 includes the magnetic platters and spindle motor 102, the read/write heads and actuator assembly 104, pre-amplifiers 106, a read/write channel 108 and a controller 110. The pre-amplifiers 106 are coupled with the read/write channel 108 via interfaces 114, 116. The controller 110 interfaces with the read/write channel 108 via interfaces 118, 120

For reads from the hard disk 100, the host device 112 provides a location identifier which identifies the location of the data on the disk drive, e.g. a cylinder and sector address. The controller 110 receives this address and determines the physical location of the data on the platters 102. The controller 110 then moves the read/write heads into the proper position for the data to spin underneath the read/write heads 104. As the data spins underneath the read/write head 104, the read/write head 104 senses the presence or absence of flux reversals, generating a stream of analog signal data. This data is passed to the pre-amplifiers 106 which amplifies the signal and passes it to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write it. The controller 110 moves the read/write heads 104 to the proper location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The generated signals are passed to the pre-amplifiers 106 via interface 116 which drive the read/write heads 104.

Figure 1B:
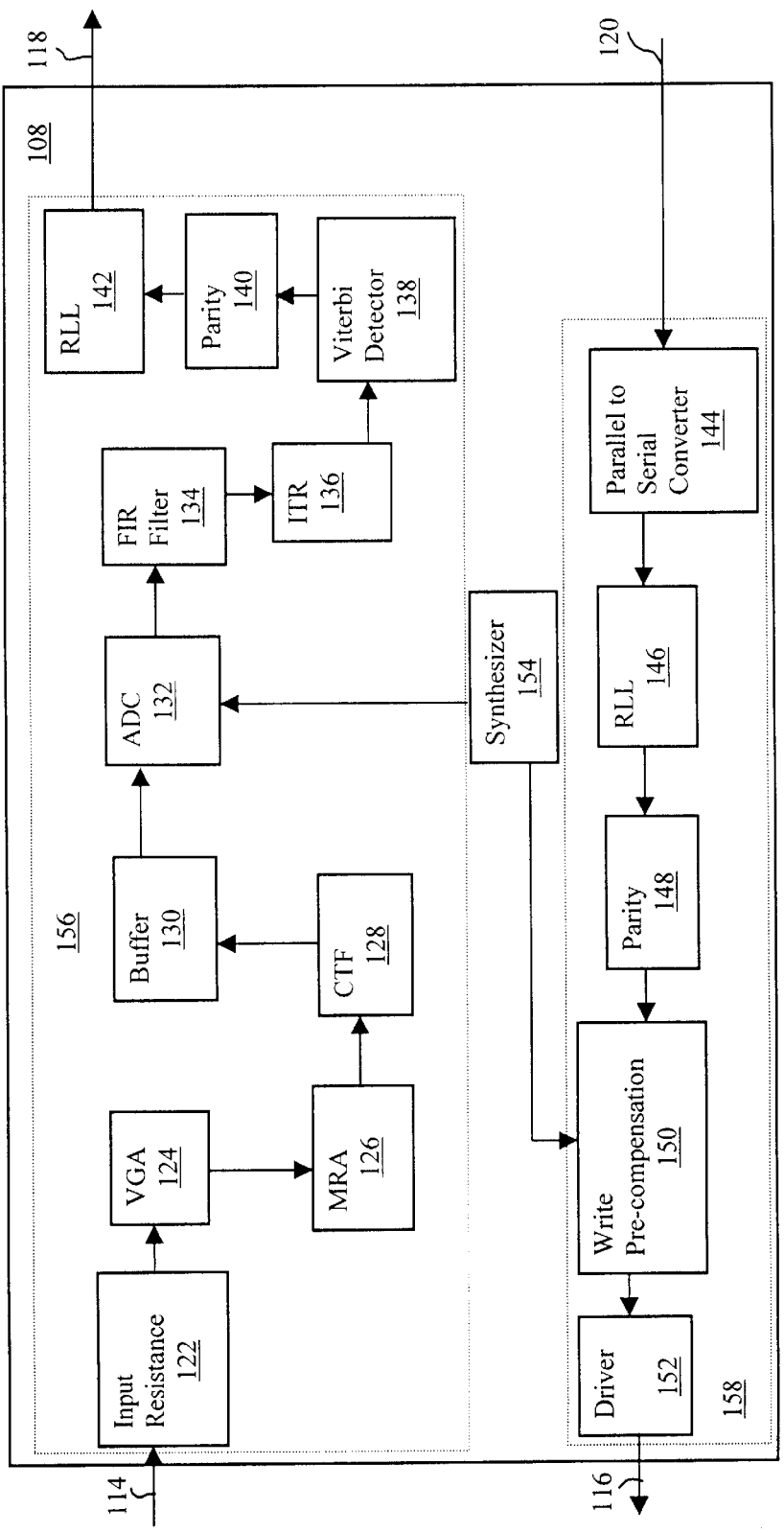
FIG. 1B depicts a block diagram of read/write channel for use with the disk drive of FIG. 1A.

Referring to FIG. 1B, there is shown an exemplary read/write channel 108 supporting Partial Response Maximum Likelihood ("PRML") encoding technology for use with the hard disk drive 100 of FIG. 1A. For clarity, some components have been omitted. The read/write channel 108 is implemented as an integrated circuit using a complementary metal oxide semiconductor ("CMOS") process at 0.18 micron. It will be appreciated that CMOS processes include processes which use metal gates as well as polysilicon gates. It will further be appreciated that other process technologies and feature sizes may used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read path 156 and the write path 158.

The write path 158 includes a parallel-to-serial converter 144, a run-length-limited ("RLL") encoder 146, a parity encoder 148, a write pre-compensation circuit 150 and a driver circuit 152. The parallel-to-serial converter 144 receives data from the host device 112 via interface 120 eight bits at a time. The converter 144 serializes the input data and sends the serial bit stream to the RLL encoder 146. The RLL encoder 146 encodes the serial bit stream into symbolic binary sequences according to a known run-length limited algorithm for recording on the platters 102. The exemplary RLL encoder uses a 32/33 bit symbol code to ensure that flux reversals are properly spaced and that long runs of data without flux reversals are not recorded. The RLL encoded data is then passed to the parity encoder 148 which adds a parity bit to the data. In the exemplary parity encoder 148, odd parity is used to ensure that long run's of 0's and 1's are not recorded due to the magnetic properties of such recorded data. The parity encoded data is subsequently treated as an analog signal rather than a digital signal. The analog signal is passed to a write pre-compensation circuit 150 which dynamically adjusts the pulse widths of the bit stream to account for magnetic distortions in the recording process. The adjusted analog signal is passed to a driver circuit 152 which drives the signal to the pre-amplifiers 106 via interface 116 to drive the read/write heads 104 and record the data. The exemplary driver circuit 152 includes a pseudo emitter coupled logic ("PECL") driver circuit which generates a differential output to the pre-amplifiers 106.

The read path 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi algorithm detector 138, a parity decoder 140 and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 which is a switching circuit to attenuate the signal and account for any input resistance. The attenuated signal is then passed to a VGA 124 which amplifies the signal. The amplified signal is then passed to the MRA 126 which adjusts the signal for any distortion created by the recording process. Essentially, the MRA 126 performs the opposite function of the write-pre-compensation circuit 150 in the write path 158. The signal is next passed through the CTF 128, which is essentially a low pass filter, to filter out noise. The filtered signal is then passed to the ADC 132 via the buffer 130 which samples the analog signal and converts it to a digital form. The digital signal is then passed to a FIR filter 134 and then to a timing recovery circuit 136. The timing recovery circuit 136 is connected (not shown in the figure) to the FIR filter 134, the NRA 126 and the VGA 124 in a feedback orientation to adjust these circuits according to the signals received to provide timing compensation. The exemplary FIR filter 134 is a 10 tap FIR filter. The digital signal is then passed to the Viterbi algorithm detector 138 which determines the binary bit pattern represented by the digital signal using digital signal processing techniques. The exemplary Viterbi algorithm detector 138 uses a 32 state Viterbi processor. The binary data represented by the digital signal is then passed to the parity decoder 140 which removes the parity bit and then to the RLL decoder 142 which decodes the binary RLL encoding symbols back into the actual binary data that they represents This data is then passed to the controller 110 via the interface 118.

The read/write channel 108 further includes a clock synthesizer 154. The clock synthesizer 154 generates the clock signals required for operating the read/write channel 108. The exemplary clock synthesizer 154 includes a phased lock look ("PLL") (not shown) with a voltage controlled oscillator and various clock dividers to generate the necessary frequencies.

In particular, the voltage gain amplifier 124 includes a continuous open loop differential amplifier which receives and amplifies a differential signal. Signals that are represented by the difference between two voltages or currents are referred to as differential signals. In effect, differential inputs subtract two input signals, a positive and a negative, from each other. A positive signal is represented when the positive input is greater than the negative input and a negative signal is represented when the negative signal is greater than the positive. When the positive input is equal to the negative input, the signal represented is zero. The result is lower noise as noise will be present on both inputs and will be subtracted away, leaving just the signal. Differential signals also offer the advantage of a requiring a lower voltage swing to represent binary values, allowing for faster switching. Further differential signals simplify grounding in a system as the signal is not derived from comparing one input with a ground reference.

One problem that can occur with differential signals is known as offsetting. Offsetting is difference in the input offset current or voltage. In particular, input offset current or voltage is the difference in bias current or voltage when measured between two differential inputs, such as the positive and negative inputs of an amplifier. The offset is essentially a difference in one of the two differential signals that is not due to the actual signal represented and is not mirrored in the other input as noise is. CMOS based amplifiers typically suffer from offset voltages introduced by mismatches of the input stage or other components of the amplifier.

Offset cancellation has been done using output offset storage. In this method, an serial capacitive circuit is placed on each of the outputs of the amplifier. The circuit is operated on a two-phase non-overlapping clock. On the first phase, the input signal is connected to the amplifier and the output of the amplifier is generated as normal. On the second phase of the clock, the signal inputs are disconnected from the amplifier and an offset compensation reference voltage is applied to both inputs of the amplifier. Similarly, the amplifier outputs are also coupled to a second offset compensation reference voltage. The voltages differentially charge the capacitors connected with each amplifier output according to the offset imparted by the amplifier. The different voltages stored in the capacitors then compensate for the offset imparted by the amplifier during normal operation.

Unfortunately, the addition of capacitors on the amplifier outputs also adds parasitic capacitance to the overall circuit reducing the bandwidth of the amplifier. Further, the output capacitors together with the input capacitance of a building block, i.e. another circuit, connected to the output of the amplifier form a voltage divider which reduces the effective output swing of the amplifier.

Herein is disclosed a technique for active offset cancellation by injecting an asymmetric bias current in the output stage of the amplifier during an auto-zero period. The auto-zero period is DEFINED. The disclosed technique cancels any statistical offsets generated within the amplifier. Since no capacitive coupling is used in the signal path, the bandwidth and effective output swing of the amplifier are maintained. In addition to eliminating additional active or passive components in the signal path, the bias current of the input stage and current mirrors does not have to be varied.

Figure 2:
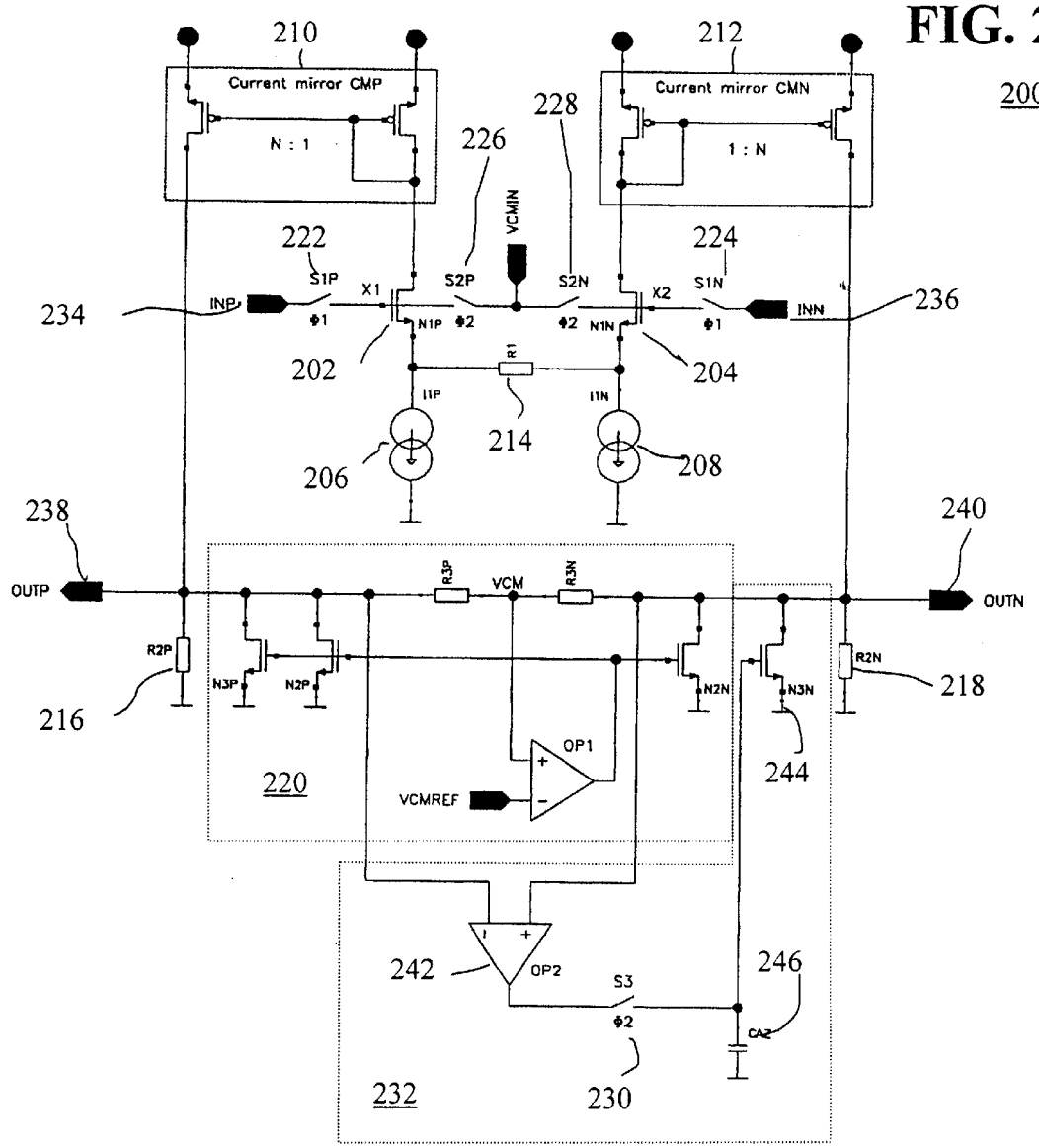
FIG. 2 depicts a gain cell based open loop amplifier stage according to a first embodiment

Referring now to FIG. 2, there is shown a first embodiment of a gain cell based open loop amplifier stage 200 for use in a variable gain amplifier. The amplifier stage 200 includes inputs 234, 236 (labeled "INP" & "INN"), positive and negative input stages 202, 204, (labeled "N1P" & "N1N"), bias current sources 206, 208 for each input stage (labeled "I1P" & "I1N"), current mirrors 210, 212 for each input stage (labeled "CMP" & "CMN"), gain setting resistors 214, 216, 218 (labeled "R1", "R2P" & "R2N"), an output common mode loop 220 (consisting of components labeled "N2P", "N2N", "N3P", "R3P", "R3N" & "OP1") and outputs 238, 240 (labeled "OUTP" & "OUTN"). Further, the amplifier stage 200 includes switches 222, 224, 226, 228 (labeled "S1P", "S1N", "S2P", "S2N") and control loop 232 (consisting of components labeled "OP2", "CAZ" & "N3N" and switch 230 labeled "S3").

The switches 222, 224, 226, 228, 230 and the control loop 232 can be used to generate an asymmetric variation of the bias current of the output stage in order to detect and cancel the output offset voltage. The op-amp 242 acts as a offset detector controlling the compensation circuit consisting of transistor 244 and capacitor 246 which acts as an offset compensator.

Figure 3:
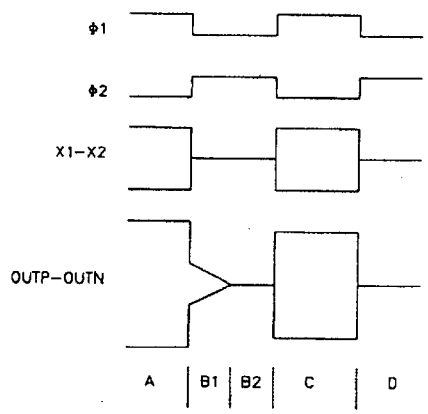
FIG. 3 depicts a timing diagram showing the operation of the amplifier stage of FIG. 2.

Referring to FIG. 3, there is shown a timing diagram 300 of the operation of the amplifier stage 200. The amplifier stage 200 operates on a two phase non-overlapping clock with phase 1 labeled "Φ" and phase 2 labeled "Φ2." The differential input signal seen at the gates of the input transistors 202, 204 is labeled as "X1–X2". The differential output signal of the amplifier 200 which contains a differential offset component is labeled "OUTP–OUTN" and represents the signal measured at outputs 238, 240. Relevant portions of the timing diagram are labeled "A", "B1", "B2", "C" and "D".

In operation, during timing portion A, switches 222, 224 are closed and switches 226, 228, 230 are open. This is the regular operation of the amplifier. For the given input differential X1–X2 at A, the OUTP–OUTN amplified differential output containing a differential offset component is shown.

At timing portion B1, switches 222, 224 are opened and switches 226, 228, 230 are closed. This disconnects the inputs 234, 236 of the amplifier 200 from the input transistors 202, 204 and at the same time connects the gates of transistors 202, 204 to an input common mode voltage, labeled "VCMIN". With the differential input voltage being zero (because both inputs are connected to the same voltage source), the output voltage OUTP-OUTN at the amplifier 200 outputs 238, 240 should be zero. Any non-zero voltage is due to offsets of one or more amplifier components. With switch 230 closed, the control loop 232 operates such that the offset at the outputs 238, 240 is reduced by means of reducing or increasing the current through resistor 218 using transistor 244 which eventually reduces the differential voltage OUTP–OUTN to zero. This is shown at timing portion B2. This happens because the op amp 242 (labeled "OP2") compares the outputs 238, 240 and places a control voltage on the gate of transistor 244 (labeled "N3N"). If the voltage at output 240 is higher than the voltage at output 238 then the output of the op-amp 242 is increased causing the gate to source voltage of transistor 244 to be increased which in turn increases the current drawn by transistor 244 from output 240 to ground. This reduces the current flowing across resistor 218 and therefore the voltage at output 240 drops. This process continues until the voltage of the output 240 is equal to the voltage at output 238. The process works opposite for the voltage at output 238 being higher than the voltage at output 240. The control voltage generated by the op-amp 242 is stored in the capacitor 246 (labeled "CAZ").

At timing portion C, switches 222, 224 are again closed and switches 226, 228, 230 are opened. These switch setting cause resumption of regular operation of the amplifier 200 except that any differential offset in OUTP-OUTN has been cancelled. The offset is cancelled because the control voltage for transistor 244 is stored in capacitor 246 maintaining the offset cancellation effect of transistor 244. Essentially timing portion C is the same as timing portion A, except that the offset has been cancelled.

Timing portion D is the same as portion B1/B2 except that only additional offset incurred during the previous operational cycle need be cancelled.

The operation of the amplifier stage 200 continues as described, alternating between operational and offset cancellation phases.

It is to be noted that suitable transistor sizes specifying channel width-to-length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A differential amplifier comprising:
    a first input stage operative to receive a first input signal of a differential signal pair;
    a second input stage operative to receive a second input signal of said differential signal pair;
    an output stage operative to produce first and second differential output signals equal to the amplification of the difference between the first signal and the second signal; and
    an offset cancellation circuit operative to actively cancel offset voltage in said first and second differential output signals added by said differential amplifier wherein said differential amplifier is responsive to a two-phase clock, wherein said first input stage is further operative to receive said first input signal on a first phase of said two-phase clock and receive a common signal on a second phase of said two-phase clock, said second input stage is further operative to receive said second input signal on first phase and receive said common signal on said second phase and further wherein said offset cancellation circuit is further operative to compute an adjusted bias current on said second phase and said offset cancellation circuit is further operative apply said adjusted bias current on said first phase to cancel said offset voltage.

2. The differential amplifier of claim 1, wherein said offset cancellation circuit further comprises an offset voltage detector operative to measure said offset voltage and an offset voltage compensator operative to substantially zero out any detected offset voltage.

3. The differential amplifier of claim 1, wherein said first input stage, said second input stage and said output stage form a signal path separate from said offset cancellation circuit.

4. A method of canceling offset between first and second stages of an open loop differential amplifier, said open loop differential amplifier being responsive to a two-phase clock, the method comprising:
    (a) disconnecting first and second differential inputs to said first and second stages from an input source on a second phase of said two phase clock;
    (b) connecting said first and second differential inputs to a common voltage source on said second phase of said two phase clock;
    (c) detecting output offset voltage on first and second differential outputs of said amplifier during said second phase;
    (d) computing an adjusted bias current to cancel said output offset voltage during said second phase;
    (e) disconnecting said first and second differential inputs from said common voltage source on a first phase of said two-phase clock;
    (f) reconnecting said first and second differential inputs to said input source on said first phase of said two-phase clock; and
    (g) applying said adjusted bias current to cancel said output offset voltage during said first phase.

5. The method of claim 4, wherein said input source comprises a differential input source.

6. The method of claim 4, wherein (d) further comprises:
    adjusting a control voltage on a current biasing transistor; and
    storing said control voltage.

7. The method of claim 6, wherein said control voltage is stored in a capacitor.

8. The method of claim 4, wherein (d) further comprises computing said adjusted bias current so that said output offset voltage is zeroed out.

9. An apparatus for canceling offset in an open loop differential amplifier comprising:
    an offset detector operative to connect first and second differential inputs of said amplifier to a common source and detect offset voltage imparted by said amplifier alone in first and second differential outputs of said amplifier and further operative to determine an appropriate bias current in said amplifier to cancel said detected offset voltage; and
    an offset compensator operative to apply said appropriate bias current to said amplifier to cancel said offset voltage
wherein said amplifier is configured to function in alternating operational and non-operational phases, wherein said offset detector is configured to operate in said non-operational phase and said offset compensator is configured to operate in said operational phase.

10. An apparatus for canceling offset in an open loop differential amplifier comprising:

means for detecting an offset voltage in first and second differential output signals of said amplifier, said offset voltage added by said amplifier, and determining an appropriate bias current in said amplifier to cancel said detected offset voltage; and means for applying said appropriate bias current to said amplifier to cancel said offset voltage wherein said amplifier is configured to function in alternating operational and non-operational phases, wherein said means for detecting an offset voltage is configured to operate in said non-operational phase and said means for applying said appropriate bias current is configured to operate in said operational phase.

* * * * *